(12) United States Patent
Okamoto

(10) Patent No.: US 6,211,942 B1
(45) Date of Patent: Apr. 3, 2001

(54) DOUBLE-SIDED EXPOSURE SYSTEM

(75) Inventor: Atsushi Okamoto, Mishima (JP)

(73) Assignee: Howa Machinery Ltd., Nagoya (JP)

( * ) Notice: Subject to any disclaimer, the term of this patent is extended or adjusted under 35 U.S.C. 154(b) by 0 days.

(21) Appl. No.: 09/523,326

(22) Filed: Mar. 10, 2000

(51) Int. Cl.⁷ .......................... G03B 27/32; G03B 27/42; G03B 27/58; G03B 27/62
(52) U.S. Cl. ................................ 355/26; 355/53; 355/72; 355/75
(58) Field of Search ................................ 355/26, 72, 75, 355/73, 53; 414/225, 321, 749; 318/640

(56) References Cited

U.S. PATENT DOCUMENTS

| | | | |
|---|---|---|---|
| 4,549,843 | * 10/1985 | Jagusch et al. | 414/416 |
| 4,598,242 | * 7/1986 | Hayashi et al. | 318/640 |
| 4,924,258 | * 5/1990 | Tsutsui | 355/53 |
| 5,337,151 | * 8/1994 | Baxter et al. | 356/401 |
| 5,532,105 | * 7/1996 | Yamadera et al. | 430/156 |
| 5,604,354 | * 2/1997 | Lauverjat | 250/548 |
| 5,909,030 | * 6/1999 | Yoshitake et al. | 250/492.2 |
| 5,923,403 | * 7/1999 | Jain | 355/26 |
| 5,929,973 | * 7/1999 | Kakiziki et al. | 355/26 |
| 5,933,216 | * 8/1999 | Dunn | 355/53 |
| 5,940,528 | * 8/1999 | Tanaka et al. | 382/151 |

FOREIGN PATENT DOCUMENTS 10-333337   12/1998   (JP) .

* cited by examiner

Primary Examiner—Russell Adams
Assistant Examiner—Hung Henry Nguyen
(74) Attorney, Agent, or Firm—Ladas and Parry

(57) ABSTRACT

A double-sided exposure system (1) has a first work holding device (21L) for holding a substrate (P) opposite to an exposure mask (55) to expose a first surface of the substrate (P) through the exposure mask (55) to light, and a second work holding device (21R) for holding the substrate (P) opposite to another exposure mask (55) to expose a second surface of the substrate (P) through the exposure mask (55) to light. Phases of operations for receiving, transferring and pretreating an unexposed substrate, and those of operations for transferring, exposing and pretreating the substrate having one surface processed by an exposure operation can be staggered to prevent time loss due to waiting during an exposure operation can be prevented even if the double-sided exposure system is provided with a single light source.

8 Claims, 10 Drawing Sheets

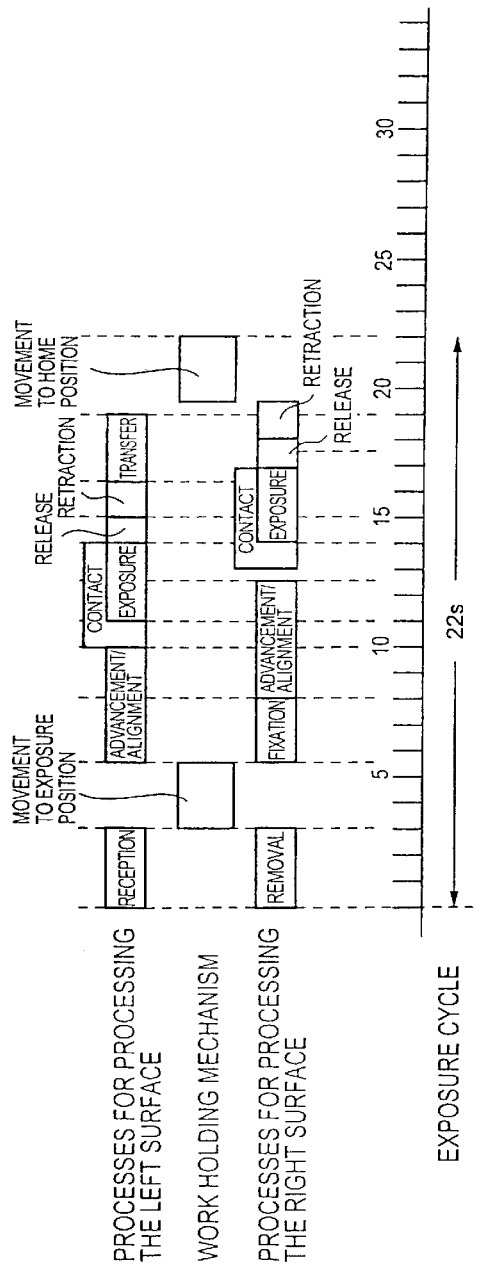
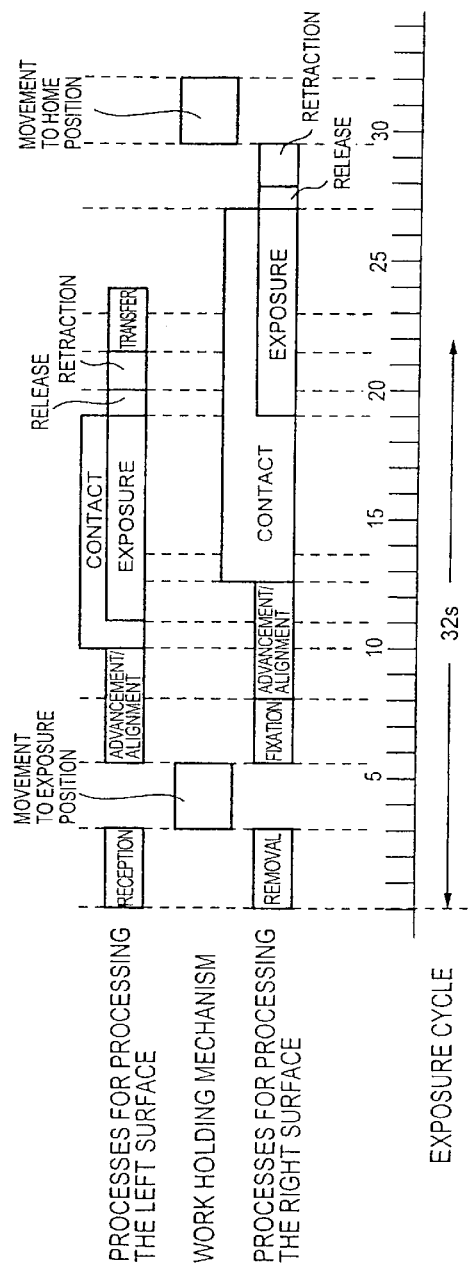

DOUBLE-SIDED EXPOSURE SYSTEM

BACKGROUND OF THE INVENTION

1. Field of the Invention

The present invention relates to a double-sided exposure system. More specifically, the present invention relates to a double-sided exposure system capable of sequentially exposing the first and second surfaces of a plate, such as a substrate for a printed wiring board or a sheet for lead frames, through an exposure mask provided with a predetermined exposure pattern to light, and, particularly, provided with a single exposure light source.

2. Description of the Related Art

Generally, an exposure system employed in, for example, a process for fabricating a high-density printed wiring board is provided with an extra-high pressure mercury lamp as an exposure light source for high resolution. The mercury lamp of such a type is a very expensive lamp costing as much as about ¥500,000. The process requires the mercury lamp to be kept continuously lighted and the life of the mercury lamp is only about 500 hr. Therefore, the exposure system of this type must be provided, if possible, with a single light source and the light source must be used at the highest possible economic efficiency; that is, it is desired to reduce the exposure cost of each substrate for a printed wiring board (the running cost of the light source) to the lowest possible extent by using the light source for as many exposure cycles as possible in its life.

To enhance the economic efficiency of the light source, it is important to enhance the operating speeds of mechanical units including a carrying mechanism for carrying substrates and alignment adjusting mechanism for aligning the substrates with an exposure mask and to reduce waiting time, such as exposure waiting time, near to naught.

Referring to FIG. 13 showing a double-sided exposure system 100 disclosed in Japanese Patent Application No. 343971/1997 (JP-A No. 333337/1998), a work holding base 101 for detachably holding a substrate P has opposite surfaces respectively provided with vacuum pads 103, and the work holding base 101 is moved repeatedly between a home position, i.e., a position indicated by chain lines, between a work receiving unit 105 and a work delivering unit 107, and an exposure position, i.e., a position indicated by solid lines, between two mask holding mechanisms 109L and 109R respectively holding exposure masks 113.

Light emitted by a mercury-short-arc lamp 111, i.e., a light source, is transmitted through a left optical path and falls on the back surface of the exposure mask 113 held by the left mask holding mechanism 109L, or the light is transmitted through a right optical path and falls on the back surface of the exposure mask 113 held by the right mask holding mechanism 109R. An optical path selecting unit, not shown, connects the mercury-short-arc lamp selectively to the left optical path or the right optical path. The work receiving unit 105 adjusts the position of an unexposed substrate P fed thereto for preparatory positioning and transfers the substrate P to the vacuum pad 103 on the left surface, as viewed in FIG. 13, of the work holding base 101 located at the home position. Upon the arrival of the work holding base 101 holding the unexposed substrate P on its left surface at the exposure position, the left mask holding mechanism 109L advances to bring the exposure mask 113 into contact with the substrate P so that the exposure mask 113 is aligned with the substrate P. After the exposure mask 113 has been exactly aligned with the substrate P, the exposure mask 113 is contacted fixedly to the substrate P.

Then an exposure cycle is executed to expose a first surface, i.e., one of the surfaces, of the substrate P through the exposure mask 113 to light.

After the exposure cycle has been completed, the left mask holding mechanism 109L is removed from the substrate P, the left mask holding mechanism 109L is retracted, a left transfer hand 115L holds the substrate P and transfers the same to a right transfer hand 115R. Meanwhile, the work holding base 101 is returned to the home position, and then moved again to the exposure position. Subsequently, the right transfer hand 115R transfers the substrate P to the right vacuum pad 103, the right mask holding mechanism 109R is advanced into contact with the substrate P so that the exposure mask 113 is aligned with the substrate P. After the exposure mask 113 has been exactly aligned with the substrate P, the exposure mask 113 is contacted fixedly to the substrate P. Then an exposure cycle is executed to expose a second surface, i.e., the other surface, of the substrate P through the exposure mask 113 to light. Thus, the exposure of both the surfaces of the substrate P is completed.

After the completion of the exposure cycle, the right mask holding mechanism 109R is removed from the substrate P, the right mask holding mechanism 109R is retracted and the work holding base 101 is returned to the home position. Then, the left vacuum pad 103 receives an unexposed substrate P from the work receiving unit 105, and the work delivering unit 107 receives the two-side exposed substrate from the right vacuum pad 103 and delivers the same.

FIG. 14A is a time chart representing sequential operations of the prior art double-sided exposure system 100. In FIG. 14A, time is measured in seconds on the horizontal axis. Generally, exposure time is about 3 s or below. In this time chart, the exposure time is 3 s, and cycle time, i.e., time need to carry out a sequence of operations from the start of reception of an unexposed substrate P to the start of reception of the next unexposed substrate P, is 22 s. As obvious from FIG. 14A, there is a scarce waiting time between the completion of the exposure of the first surface of the substrate P and the start of the exposure of the second surface of the substrate P when the exposure time of the double-sided exposure system 100 is on the order of 3 s.

Some resist that is applied to the substrate P requires a longer exposure time. When a long exposure time is necessary, an exposure operation for exposing the second surface of the substrate P to light cannot be started before the completion of an exposure operation for exposing the first surface of the substrate P to light even if preparatory operations of the mechanical units for exposure are completed, which produces a time loss.

FIG. 14B is a time chart representing sequential operations of the prior art double-sided exposure system 100, in which exposure time is 8 s for both the surfaces of the substrate P. In this case, there is a waiting time of 5.5 s between the completion of preparations for the exposure of the second surface of the substrate P to light and the start of the exposure operation for exposing the second surface to light, and there is a waiting time of 5.5 s between the completion of transfer of the substrate P from the left side to the right side of the work holding base 101 and the start of shifting the work holding base 101 to the home position, i.e., during operations for exposing the second surface of the substrate P to light and post-operations. Consequently, the cycle time is as long as 32 s, which is about 1.5 times the cycle time needed by the operations shown in FIG. 14A and hence the running cost of the lamp 111 increases sharply near to 1.5 times the running cost needed by the operations shown in FIG. 14A.

SUMMARY OF THE INVENTION

The present invention has been made in view of the foregoing problems and it is therefore an object of the present invention to provide a double-sided exposure system capable of suppressing significant increase in time loss even if exposure time increases.

With the foregoing object in view, the present invention provides a double-sided exposure system for exposing opposite side surfaces of a plate to light through a pair of exposure masks respectively provided with necessary exposure patterns, comprising a first mask holding mechanism holding a first exposure mask to be used in exposing a first surface of the plate to light; a first work holding base capable of moving between a first exposure position in front of the first mask holding mechanism and a first home position where an unexposed plate is mounted thereon; a second mask holding mechanism holding a second exposure mask to be used in exposing a second surface of the plate to light; a second work holding base capable of moving between a second exposure position in front of the second mask holding mechanism and a second home position where the two-side exposed plate is removed therefrom; a single light source; an optical path selecting optical system for selectively connecting the light source to a first optical path leading to the first exposure position or a second optical path leading to the second exposure position; and a work transfer mechanism capable of receiving the plate having the exposed first surface exposed to light at the first exposure position from the first work holding base and of transferring the plate to the second work holding base so that the second surface of the plate can be exposed to light.

According to the present invention, the double-sided exposure system is provided with the two work holding bases, i.e., the first work holding base specially for exposing the first surface of the plate to light and the second work holding base specially for exposing the second surface of the plate to light. Therefore, phases of operations for receiving and carrying an unexposed plate, exposing one of the surfaces of the plate to light and preparatory processes can be shifted relative to phases of operations for carrying a plate having an exposed surface, exposing the other surface of the plate to light and preparatory processes. Therefore, the phases of operations of the first processing unit (the first mask holding mechanism and the first work holding base) and those of the second processing unit (the second mask holding mechanism and the second work holding base) can be shifted relative to each other so that the second processing unit carries out an exposure operation while the first processing unit is carrying out an operation other than an exposure operation. Thus, time loss due to waiting for an exposure operation can be surely prevented even if a single light source is employed.

Time loss due to a time interval for the movement of the work holding base as well as the time loss due to waiting for exposure can be prevented by timing the operations of the components so that the work transfer mechanism is able to mount the plate having one exposed surface on the second work holding base before the second work holding base reaches the second exposure position after the operations for exposure of the first processing unit has been completed.

In the double-sided exposure system according to the present invention, it is preferable that the first work holding base is able to hold the plate in a vertical position at least during an exposure operation for exposing one of the surfaces of the plate to light, and the second work holding base is able to hold the plate in a vertical position at least during an exposure operation for exposing the other surface of the plate to light.

When the first and the second work holding base are able to thus hold the plate in a vertical position, the exposure operation can be carried out with both the exposure mask and the plate held in a vertical position, which is effective in preventing faulty exposure attributable to the adhesion of dust to the surfaces of the plate.

In the double-sided exposure system according to the present invention, it is preferable that the first and the second mask holding mechanism are disposed opposite to each other, and the work transfer mechanism transfers the plate from the first work carrying device to the second work carrying device in a space between the first and the second mask holding mechanism disposed opposite to each other with at least one of the first and the second work holding base disposed respectively at their home positions.

Thus, any special space for transferring the plate is scarcely necessary and hence the double-sided exposure system can be formed in compact construction.

BRIEF DESCRIPTION OF THE DRAWINGS

The above and other objects, features and advantages of the present invention will become more apparent from the following description taken in connection with the accompanying drawings, in which:

FIGS. 14A and 14B are time charts representing sequential operations of the prior art double-sided exposure system shown in FIG. 13.

DESCRIPTION OF THE PREFERRED EMBODIMENTS

The construction of a double-sided exposure system 1 in a preferred embodiment according to the present invention for processing substrates for forming printed wiring boards by an exposure process will be described with reference to FIGS. 1 to 3.

Figure 1:
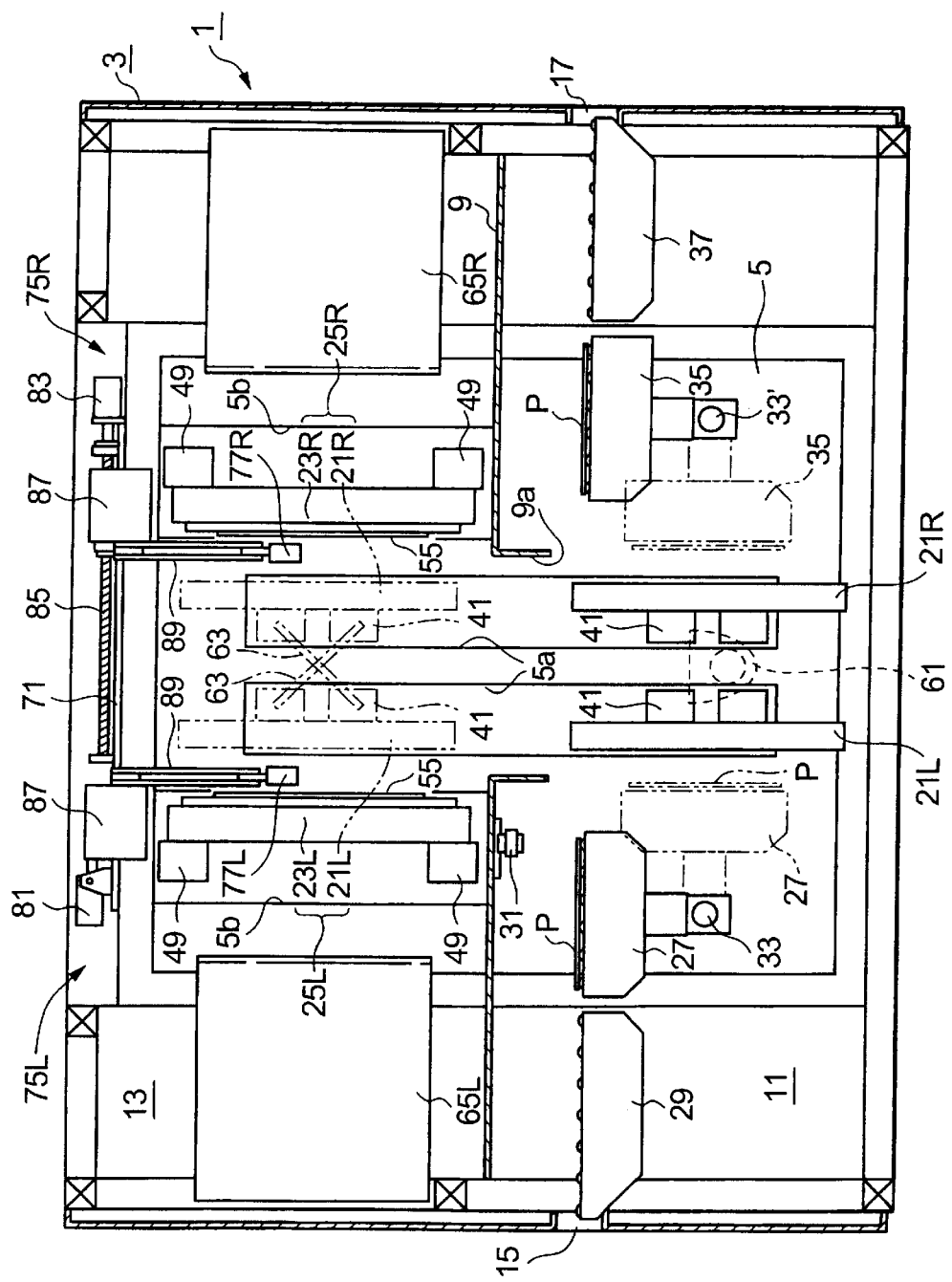
FIG. 1 is a cutaway front elevation of a double-sided exposure system in a preferred embodiment of the present invention, in which a case is partly cut away.

In FIG. 1, it is supposed that this side of the paper is the front side, the other side of the paper is the back side, the left side of the drawing is the left side and the right side of the drawing is the right side. Referring to FIGS. 1 to 3, a base plate 5 similar to a wall is set up vertically in a middle region of the interior of a case 3 to define an optical system chamber 7 behind the base 5. A horizontal partition plate 9 is disposed in a space in front of the base plate 5 on a level at the middle of the height of the space. A space under the partition plate 9 serves as a receiving/delivering chamber 11, and a space over the partition plate 9 serves as an exposure chamber 13. An opening 9a is formed in a middle part of the partition plate 9. The receiving/delivering chamber 11 and the exposure chamber 13 communicates with each other by means of the opening 9a. A work entrance 15 and a work exit 17 are formed in the left and the right side wall of the case 3, respectively. A left work elevator (first work holding device) 21L and a right work elevator (second work holding device) 21R are disposed in the case 3 so as to move vertically through the opening 9a. A left mask holding mechanism 23L and a right mask holding mechanism 23R are disposed in the exposure chamber 13 on the outer side of the paths of the left work elevator 21L and the right work elevator 21R, respectively. The left work elevator 21L and the left holding mechanism 23L constitute a first processing unit 25L. The right work elevator 21R and the right mask holding mechanism 23R constitute a second processing unit 25R. The first processing unit 25L is used mainly for exposing to light a first surface of a substrate P for forming a printed wiring board, and the second processing unit 25R is used mainly for exposing to light a second surface of the substrate P.

A loading device 27 is placed in a left region of the receiving/delivering chamber 11 on the left side of the work elevator 21L. A receiving conveyor 29 has a left end facing the work entrance 15. A substrate P fed by a feed conveyor, not shown, extended on the left side of the case 3 is delivered through the work entrance 15 onto the receiving conveyor 29. The substrate P has opposite surfaces respectively coated with ultraviolet curable resist films. The substrate P is transferred by a driving roller, not shown, included in the receiving conveyor 29 from the receiving conveyor 29 onto the loading device 27. The loading device 27 has a holding function to hold the substrate P by suction on the loading table, and an aligning function to adjust the position of the forward edge of the substrate P in cooperation with a prealignment sensor 31 (FIG. 1). After the substrate P has been correctly set on the loading device 27 by prealignment, the loading device 27 is turned through an angle of 90° to a position indicated by two-dot chain lines in FIG. 1, and is moved horizontally. The loading device 27 is supported on a shaft 33 projecting forward from the base plate 5. The shaft 33 is supported on a moving means, not shown, disposed on the back side of the base plate 5 and capable of moving in lateral directions.

An unloading device 35 is disposed on the right side of the path of the work elevator 31R, and a delivery conveyor 37 is disposed on the right side of the unloading device 35. The unloading device 35 has an upper surface in which a vacuum can be created when necessary by a vacuum means, not shown. The unloading device 35 can be set in a horizontal position indicated by solid lines in FIG. 1, can be turned through an angle of 90° from the horizontal position to a vertical position in which its upper surface is faced to the left. The unloading device 35 is supported on a shaft 33' projecting forward from the base plate 5. The shaft 33' is supported on a moving means, not shown, disposed on the back side of the base plate 5 and capable of moving in lateral directions.

The delivery conveyor 37 has a right end facing the work exit 17. When the right work elevator 21R holding the substrate P came down to the home position, the unloading device 35 set in a vertical position receives the substrate P from the right work elevator 21R and then the unloading device 35 is turned to a horizontal position. The substrate P is transferred from the unloading device 35 to the delivery conveyor 37 by a driving roller, not shown, included in the unloading device 35. The delivery conveyor 37 transfers the substrate P through the work exit 17 to a conveyor, not shown, for conveying the substrate P to the next process, such as a developing process.

Figure 2:
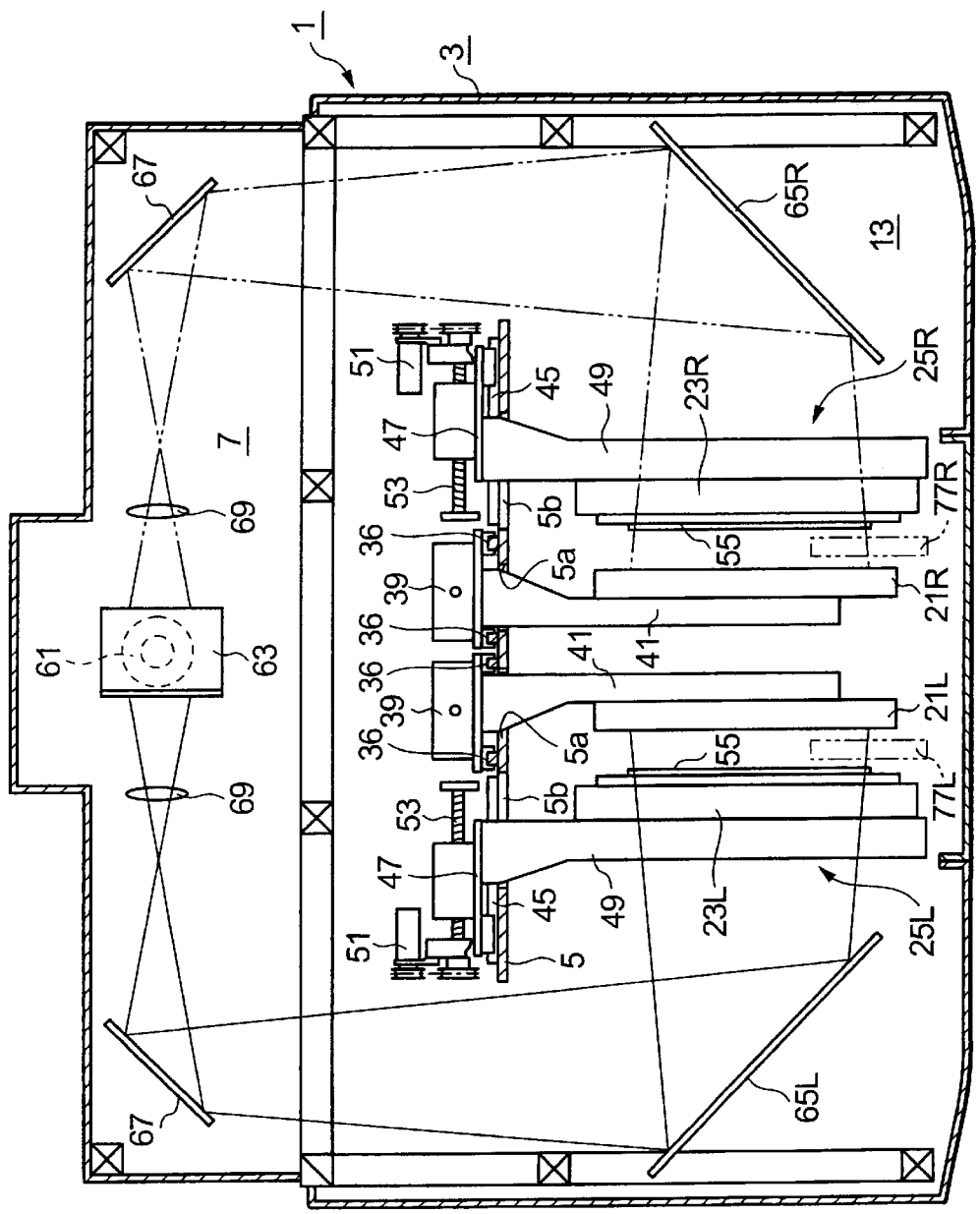
FIG. 2 is a plan view of an essential part of the double-sided exposure system shown in FIG. 1.

As shown in FIG. 2, a pair of parallel, right vertical guide rails 36 and a pair of parallel, left vertical guide rails 36 are attached to a middle part of the back surface of the base plate 5 with respect to lateral directions. Sliding bases 39 slide along the right and the left vertical guide rails 36, respectively. Horizontal arms 41 project forward from the sliding bases 39 through slots 5a formed in the base plate 5, respectively. The work elevators 21L and 21R are fixed to the forward ends of the horizontal arms 41, respectively.

The work elevators 21L and 21R are capable of holding a substrate P in a vertical position by suction and of vertical movement. Although the work elevators 21L and 21R are shown typically in simple rectangular flat plates in the drawings, actually, each of the work elevators 21L and 21R has a moving base having the shape of a vertical wall, a vacuum pad provided with a plurality of suction holes and attached to one side surface, i.e., the left side surface for the left work elevator 21L or the right side surface for the right work elevator 21R, of the moving base, and a vacuum system connected to the vacuum pad. A substrate P can be detachably held by suction on the vacuum pad.

The sliding bases 39 are moved by ball screws driven for rotation by servomotor, not shown, respectively, to move the work elevators 21L and 21R vertically through the opening 9a of the partition plate 9. The work elevators 21L and 21R move between their home positions indicated by solid lines in FIG. 1 between the loading device 27 and the unloading device 35, and their exposure positions indicated by two-dot chain lines in FIG. 1 between the mask holding mechanisms 23L and 23R, respectively.

As shown in FIG. 2, horizontal guide rails 45 are attached to parts of the back surface of the base plate 5 on the left and the right side of the vertical guide rails 36 so as to extend laterally. Sliding bases 47 slides along the horizontal guide rails 45. Arms 49 are projected horizontally forward from the sliding bases 47 through openings 5b formed in the base plate 5, respectively. Each sliding base 47 is provided with a ball screw, i. e., a threaded nut, not shown, and a threaded rod 53 is linked to the threaded nut by ball bearings. The threaded rod 53 is driven for rotation by a servomotor 51. The threaded rod 53 is rotated to move the sliding base 47 laterally. The mask holding mechanism 23L (23R) is moved between a back position spaced apart from the path of the work elevator 21L (21R) and an forward position where a mask held by the mask holding mechanism 23L (23R) is in contact with the substrate P held on the work elevator 21L (21R). Although the mask holding mechanisms 23L and 23R are shown typically in simple rectangular flat plates in the drawings, actually, each of the mask holding mechanism 23L and 23R has a rectangular base, an alignment unit attached to one side surface, i.e., the right side surface for the left mask holding mechanism 23L or the left side surface for the right mask holding mechanism 23R, of the base, an exposure mask 55 indicated by dots in FIG. 3, and a camera for detecting errors in alignment. The position of the alignment unit in a vertical plane is adjusted for the fine positional adjustment of the exposure mask 55.

The exposure mask 55 is provided with a predetermined transparent pattern, and photomask marks, not shown, formed at predetermined positions. The degree of alignment of the photomask marks with reference holes formed in a substrate P is measured by the camera to align the exposure mask 55 with the substrate P.

A single lamp 61 is disposed in a lower middle region of the optical system chamber 7 of the case 3. The lamp 61 is a mercury-short-arc lamp. The lamp 61 emits light straight upward. A semitransparent turnable mirror 63 is disposed above the lamp 61. The turnable mirror 63 can be set in a first position indicated by broken lines in FIG. 1 to reflect the light emitted by the lamp 61 to the left, a second position indicated by two-dot chain lines in FIG. 1 to reflect the light emitted by the lamp 61 to the right or a neutral position, i.e., a horizontal position.

An illuminating mirror 65L is disposed on the left side of the left mask holding mechanism 23L, and an illuminating mirror 65R is disposed on the right side of the mask holding mechanism 23R. Reflecting mirrors 67 are disposed at the left and the right end of the optical system chamber 7. Compound-eye (fry-eye) lenses 69 are disposed between one of the reflecting mirrors 67 and the turnable mirror 63 and between the other reflecting mirror 67 and the turnable mirror 63, respectively. In a state where the turnable mirror 63 is set in the first position, the light emitted by the lamp 61 is reflected by the left reflecting mirror 67 and the left illuminating mirror 65L toward the exposure mask 55 held by the left mask holding mechanism 23L. In a state where the turnable mirror 63 is set in the second position, the light emitted by the lamp 61 is reflected by the right reflecting mirror 67 and the right illuminating mirror 65R toward the exposure mask 55 held by the right mask holding mechanism 23R.

When the left work elevator 21L holding a substrate P is located at the exposure position and the turnable mirror 63 is turned and set in the first position, the left exposure mask 55 is brought into contact with a first surface of the substrate P, the first surface of the substrate P is exposed through the left exposure mask 55 to the light emitted by the lamp 61 to form a latent image of the exposure pattern of the left exposure mask 55 on the first surface of the substrate P. When the right work elevator 21R holding the substrate P is located at the exposure position and the turnable mirror 63 is turned and set in the second position, the right mask 55 is brought into contact with a second surface of the substrate P, the second surface of the substrate P is exposed through the right exposure mask 55 to the light emitted by the lamp 61 to form a latent image of the exposure pattern of the right exposure mask 55 on the second surface of the substrate P.

Figure 3:
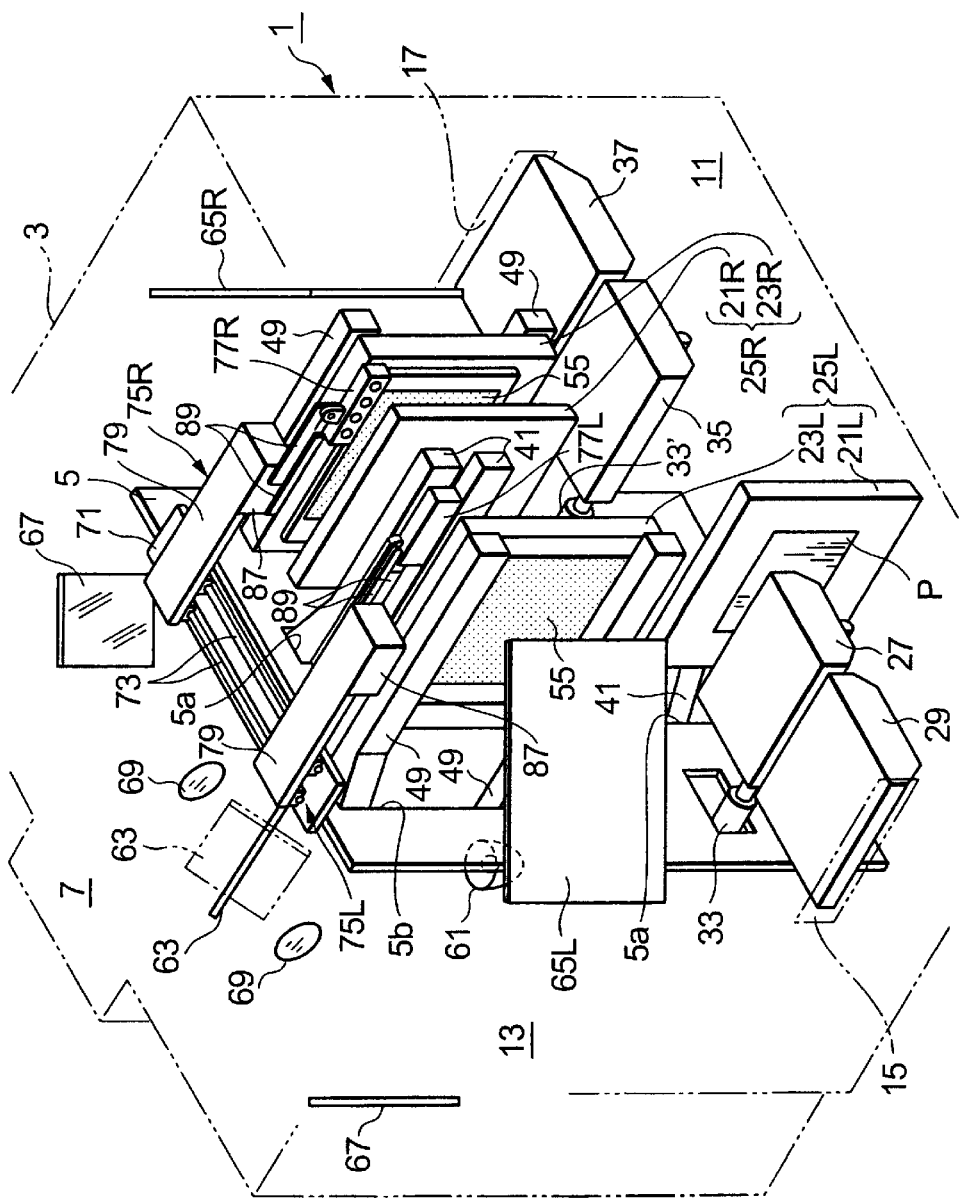
FIG. 3 is a perspective view of an essential part of the double-sided exposure system shown in FIG. 1.

Referring to FIG. 3, transfer mechanisms 75L and 75R have transfer hands 77L and 77R, and sliding bases 79, respectively. A top base plate 71 is placed on the base plate 5, and guide rails 73 are extended laterally on the top base plate 71. The sliding bases 79 having the shape of an elongate flat plate, are extended horizontally forward and have rear end parts slidably supported on the guide rails 73. The left sliding base 79 is moved laterally through a relatively short distance by a pneumatic actuator 81 (FIG. 1), and the right sliding base 79 is moved laterally through a relatively long distance by a ball screw 85 driven for rotation by a servomotor 83. Transfer hand driving units 87 are attached to forward end parts of the sliding bases 79, respectively. The transfer hand driving units 87 are provided with parallel linkages 89, respectively. Transfer hands 77L and 77R are attached to the operative ends of the parallel linkages 89, respectively. The transfer hand 77L (77R) is a hollow structure having opposite side members provided with suction projections. Hollow spaces in the transfer hands 77L and 77R are connected to a suction means, not shown. When the hollow spaces are evacuated, a suction is produced on the tip surfaces of the suction projections.

The parallel linkages 89 can be turned through an angle of about 90° between horizontal positions at which the parallel linkages 89 extend horizontally forward and vertical positions where the parallel linkages 89 extend vertically downward. When the parallel linkages 89 are turned, the transfer hands 77L and 77R held in a horizontal position are moved vertically between a waiting position on a level above the mask holding mechanisms 23L and 23R as shown in FIG. 3, and a lower position on a level somewhat higher than the middle parts of the mask holding mechanisms 23L and 23R as shown in FIG. 1.

The operation of the double-sided exposure system 1 will be described with reference to FIGS. 4 to 12. FIGS. 4 to 11 are views of assistance in explaining time-series operations of the double-sided exposure system 1, and FIG. 12 is a time chart showing the sequential operations of the double-sided exposure system 1. In an initial stage of operation, only the first processing unit 25L operates, and operations indicated by asterisks (✖) in FIG. 12 are not carried out until the first processing unit 25L accomplishes the first exposure cycle. In FIG. 12, intervals between vertical broken lines correspond to 1 s.

In an initial state, the work elevators 21L and 21R are located at their home positions, respectively, the mask holding mechanisms 23L and 23R are held at the back positions, respectively, the loading table device 27 and the unloading device 35 are held in a horizontal position with their upper surfaces facing up, and the transfer hands 77L and 77R are at their waiting positions, respectively. The turnable mirror 63 is set in the neutral position. Upon the start of the double-sided exposure system 1, the lamp 61 is turned on. The lamp 61 is left on until the double-sided exposure system is stopped. Then, a substrate P is delivered to the receiving conveyor 29, the substrate P is transferred from the receiving conveyor 29 to the loading device 27, the position of the substrate P on the loading device 27 is adjusted for prealignment. Subsequently, as shown in FIG. 4, the loading device 27 is set in the vertical position and is moved toward the work elevator 21L to make the work elevator 21L hold the substrate P by suction ("reception" in FIG. 12).

Figure 4:
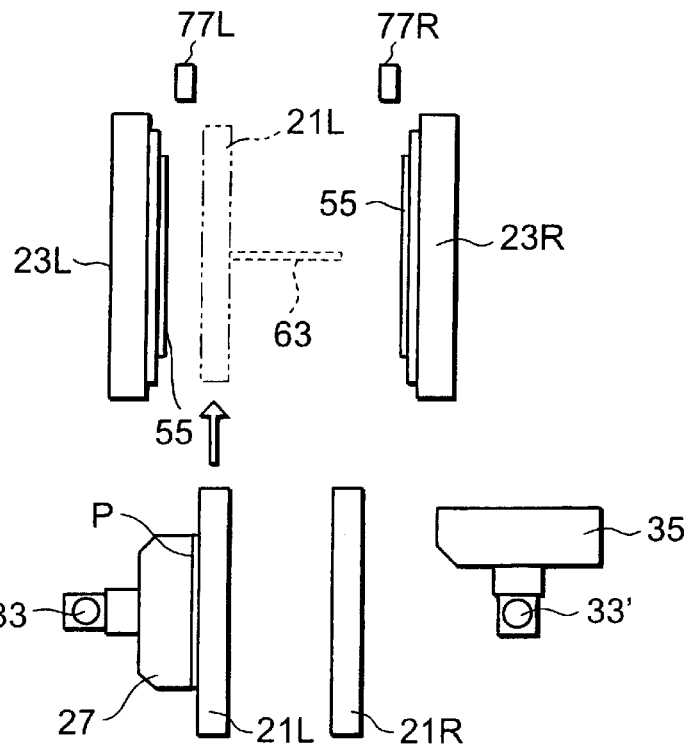
FIG. 4 is a schematic front elevation of assistance in explaining an unexposed substrate receiving operation of a left work elevator in the double-sided exposure system shown in FIG. 1.

The left work elevator 21L holding the substrate P is raised to the exposure position indicated by two-dots chain lines in FIG. 4 ("ascent" in FIG. 12). Then, the loading device 27 is returned to its original position, carries out processes for receiving the next substrate P, and is kept waiting until the left work elevator 21L is lowered to its waiting position.

Figure 5:
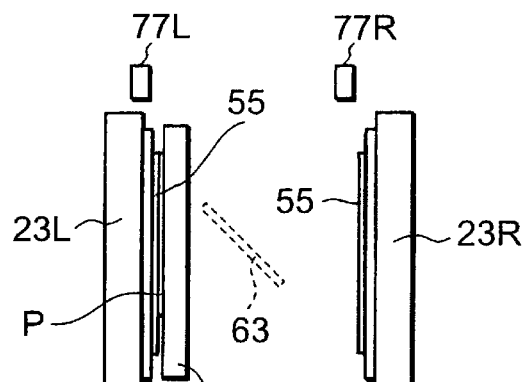
FIG. 5 is a schematic front elevation of assistance in explaining an exposure operation of a first processing unit in the double-sided exposure system shown in FIG. 1.

When the left work elevator 21L is located at the exposure position, a first surface of the substrate P is placed opposite to the left mask holding mechanism 23L. Then, the left mask holding mechanism 23L is moved to the forward position ("advancement" in FIG. 12) so that the exposure mask 55 is brought into light contact with the substrate P and is aligned with the substrate P ("alignment" in FIG. 12). Then, the exposure mask 55 is set in close contact with the substrate P ("contact" in FIG. 12). Then, the turnable mirror 63 is turned and set in the first position ("first position" in FIG. 12). Consequently, ultraviolet radiation emitted by the lamp 61 falls through the exposure mask 55 held by the mask holding mechanism 23L on the first surface of the substrate P as shown in FIG. 5 ("exposure" in FIG. 12). After the first surface of the substrate P has been irradiated with the ultraviolet radiation for a necessary exposure time of, for example about 8 s, the turnable mirror 63 is returned and set in the neutral position, the exposure mask 55 is removed from the substrate P ("release" in FIG. 12), and then the left mask holding mechanism 23L is retracted to the back position ("retraction" in FIG. 12).

Figure 6:
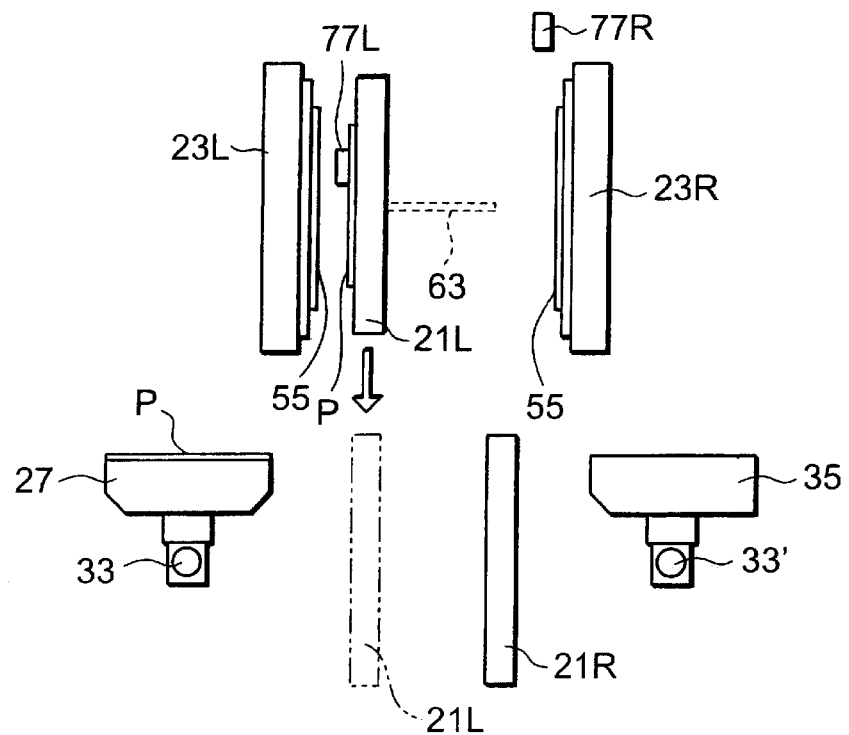
FIG. 6 is a schematic front elevation of assistance in explaining a substrate receiving operation of a left transfer hand in the double-sided exposure system shown in FIG. 1.
Figure 7:
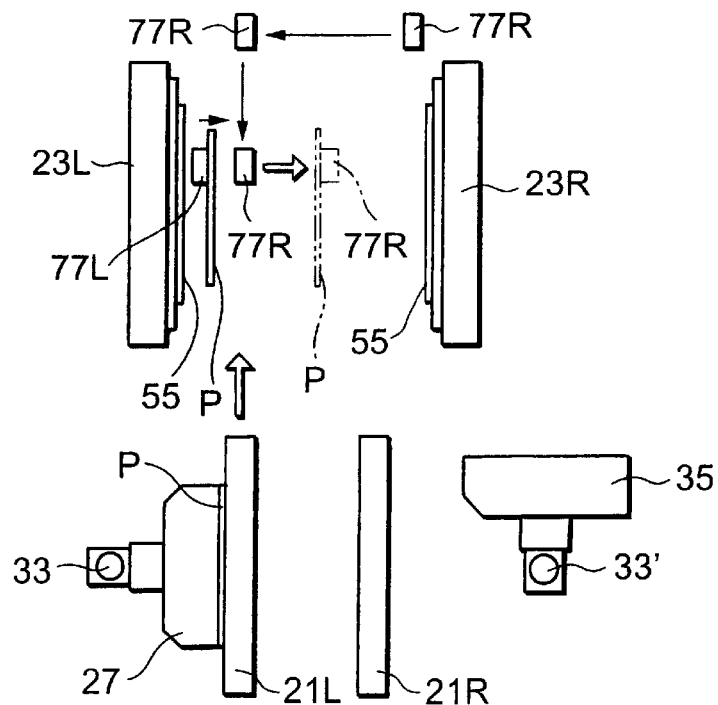
FIG. 7 is a schematic front elevation of assistance in explaining a work transfer operation for transferring a substrate between right and left transfer hands in the double-sided exposure system shown in FIG. 1.

Subsequently, the left transfer hand 77L is moved via the lower position to the right, holds the substrate P by suction and moves to the lower position as shown in FIG. 6 ("transfer" in FIG. 12). The substrate P having the exposed first surface is thus transferred from the left work elevator 21L to the left transfer hand 77L. Then, the left work elevator 21L is lowered to the home position indicated by two-dot chain lines in FIG. 6 ("descent" in FIG. 12). The left work elevator 21L receives the next substrate P from the loading device 27 at the home position.

Meanwhile, after the left work elevator 21L has reached the home position, the right transfer hand 77R is moved to the left on the level of the waiting position, and is lowered to the lower position so as to face the substrate P held by the left transfer hand 77L from the right side. Then, the substrate P is transferred from the left transfer hand 77L to the right transfer hand 77R ("transfer" in FIG. 12). Then, the right transfer hand 77R holding the substrate P is moved horizontally to a position indicated by two-dot chain lines in FIG. 7 between the paths of the left work elevator 21L and the right work elevator 21R. The right transfer hand 77R is kept waiting at the position ("reception and waiting" in FIG. 12).

Subsequently, the first processing unit 25L repeats the raising operation, the advancing operation, the alignment operation and the exposure operation. Meanwhile, the right transfer hand 77R moves to a position between the right work elevator 21R and the mask holding mechanism 23R ("rightward movement" in FIG. 12) immediately after the first processing unit 25L has started the alignment operation. The time when the alignment operation is started corresponds to the time when the right work elevator 21R completes moving from the exposure position to the home position in the second and the following exposure cycles. Then, the right work elevator 21R rises to the exposure position ("ascent" in FIG. 12).

Figure 8:
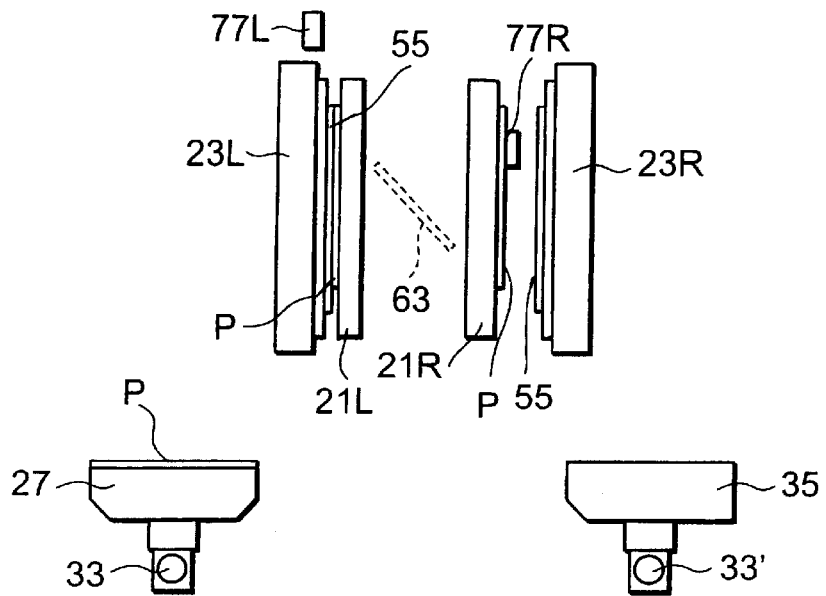
FIG. 8 is a schematic front elevation of assistance in explaining an exposure operation of the first processing unit and a substrate mounting operation of a right work elevator in the double-sided exposure system shown in FIG. 1.

Subsequently, the right transfer hand 77R moves leftward to transfer the substrate P having the exposed first surface to the right work elevator 21R and the right work elevator 21R holds the substrate P by suction as shown in FIG. 8 ("fixation" in FIG. 12). The substrate P is held by suction on the right work elevator 21R with a second surface thereof faced to the right; that is, the substrate P is inverted in a process for transferring the substrate P from the left work elevator 21L to the right work elevator 21R. Subsequently, the right transfer hand 77R is returned to the waiting position.

While the first processing unit 25L is in an exposure operation, the right mask holding mechanism 23R of the second processing unit 25R moves to the forward position ("advancement" in FIG. 12) to bring the exposure mask 55 into light contact with the second surface of the substrate P, and the mask 55 is aligned with the substrate P ("alignment" in FIG. 12). The first processing unit 25L completes the exposure operation just before the completion of the alignment operation, and the turnable mirror 63 is turned and set in the neutral position.

Figure 9:
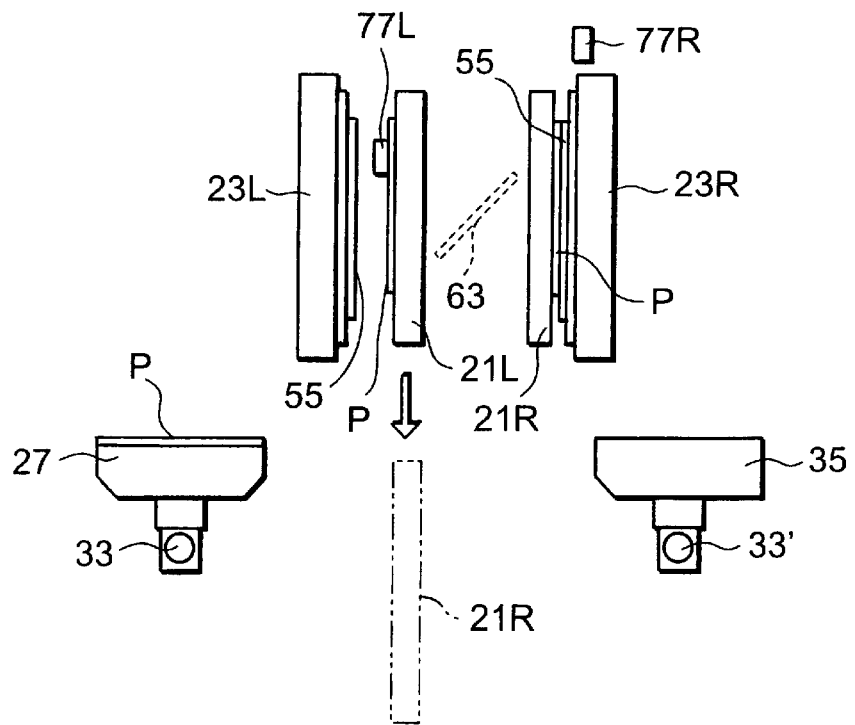
FIG. 9 is a schematic front elevation of assistance in explaining a substrate receiving operation of the left transfer hand and an exposure operation of a second processing unit in the double-sided exposure system shown in FIG. 1.

In the second processing unit 25R, the exposure mask 55 held by the right mask holding mechanism 23R is set in close contact with the substrate P ("close contact" in FIG. 12) after the completion of the alignment operation. Then, the turnable mirror 63 is turned and set in the second position ("second position" in FIG. 12) to irradiate the second surface of the substrate P through the exposure mask 55 held by the right mask holding mechanism 23R with ultraviolet radiation emitted by the lamp 61 ("exposure" in FIG. 12) as shown in FIG. 9. In the first processing unit 25L, the substrate P having the first surface processed by the exposure operation is transferred from the work elevator 21L to the transfer hand 77L, and the work elevator 21L moves down to the home position to receive the next substrate P.

Figure 10:
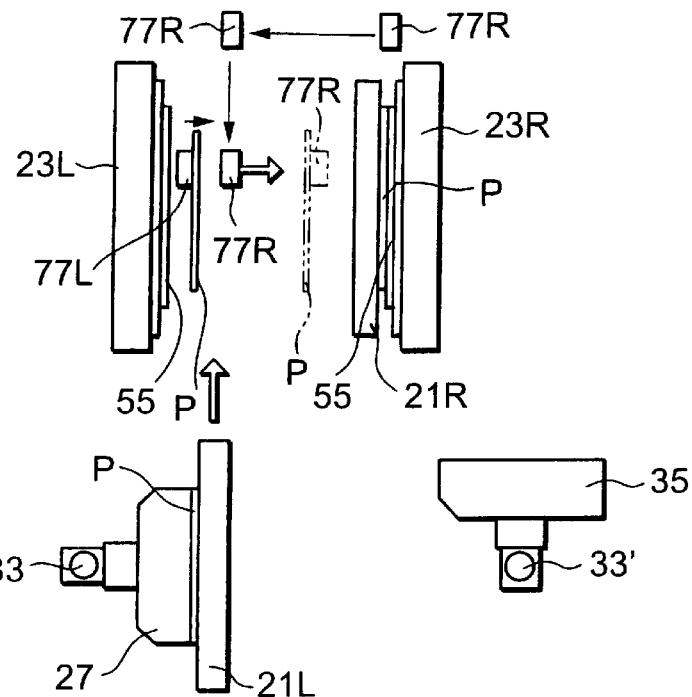
FIG. 10 is a schematic front elevation of assistance in explaining the simultaneous exposure operation of the second processing unit and a transfer operation between the right and the left transfer hand in the double-sided exposure system shown in FIG. 1.

While the second processing unit 25R is in the exposure operation, the right transfer hand 77R receives the substrate P having the first surface processed by the exposure operation from the left transfer hand 77L as shown in FIG. 10.

Figure 11:
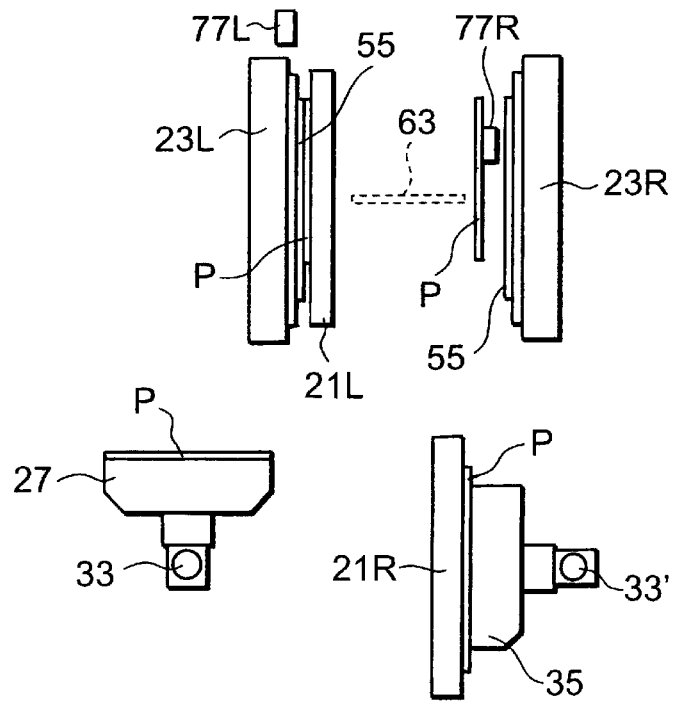
FIG. 11 is a schematic front elevation of assistance in explaining the exposure operation of the first processing unit and a two-side exposed substrate removing operation in the double-sided exposure system shown in FIG. 1.
Figure 12:
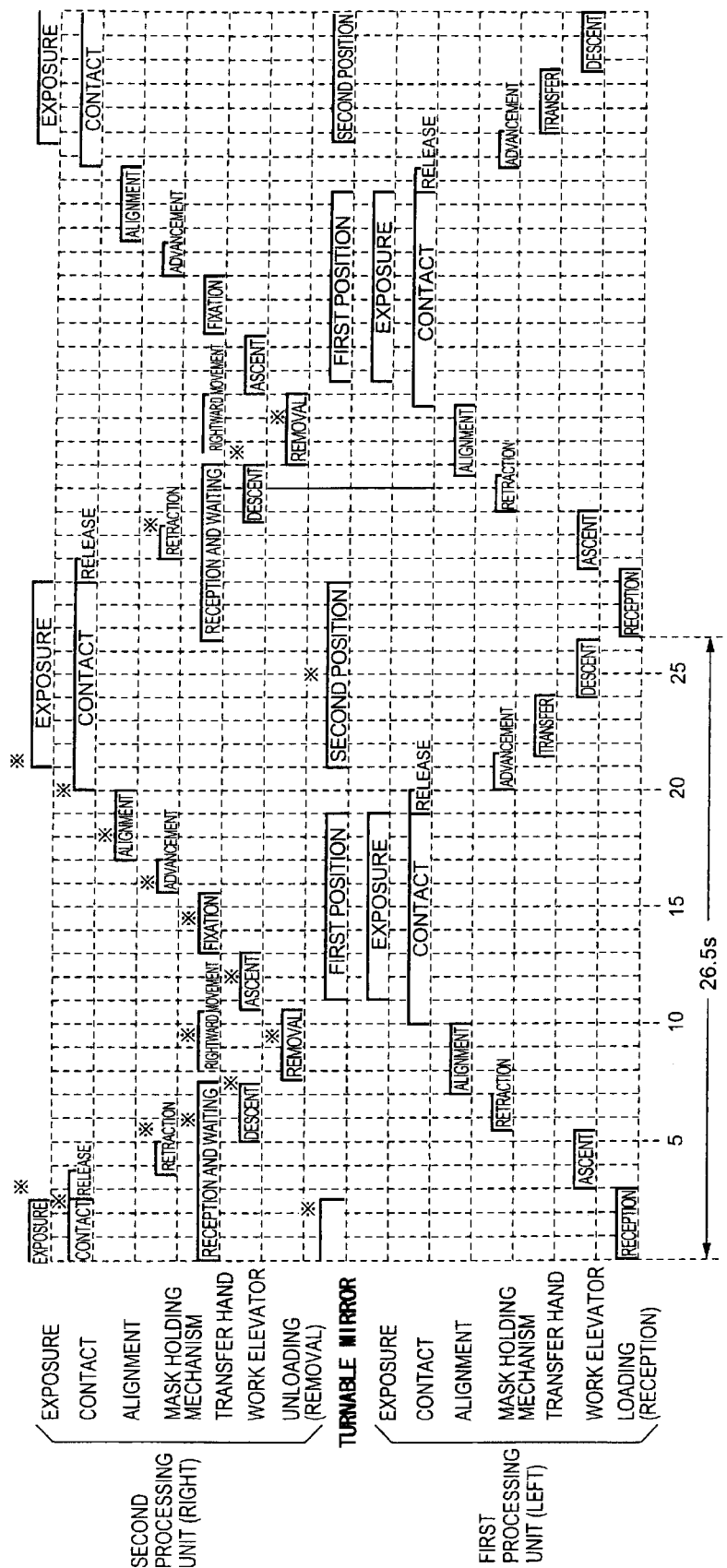
FIG. 12 is a time chart showing sequential operations to be carried out by the double-sided exposure system shown in FIG. 1.
Figure 13:
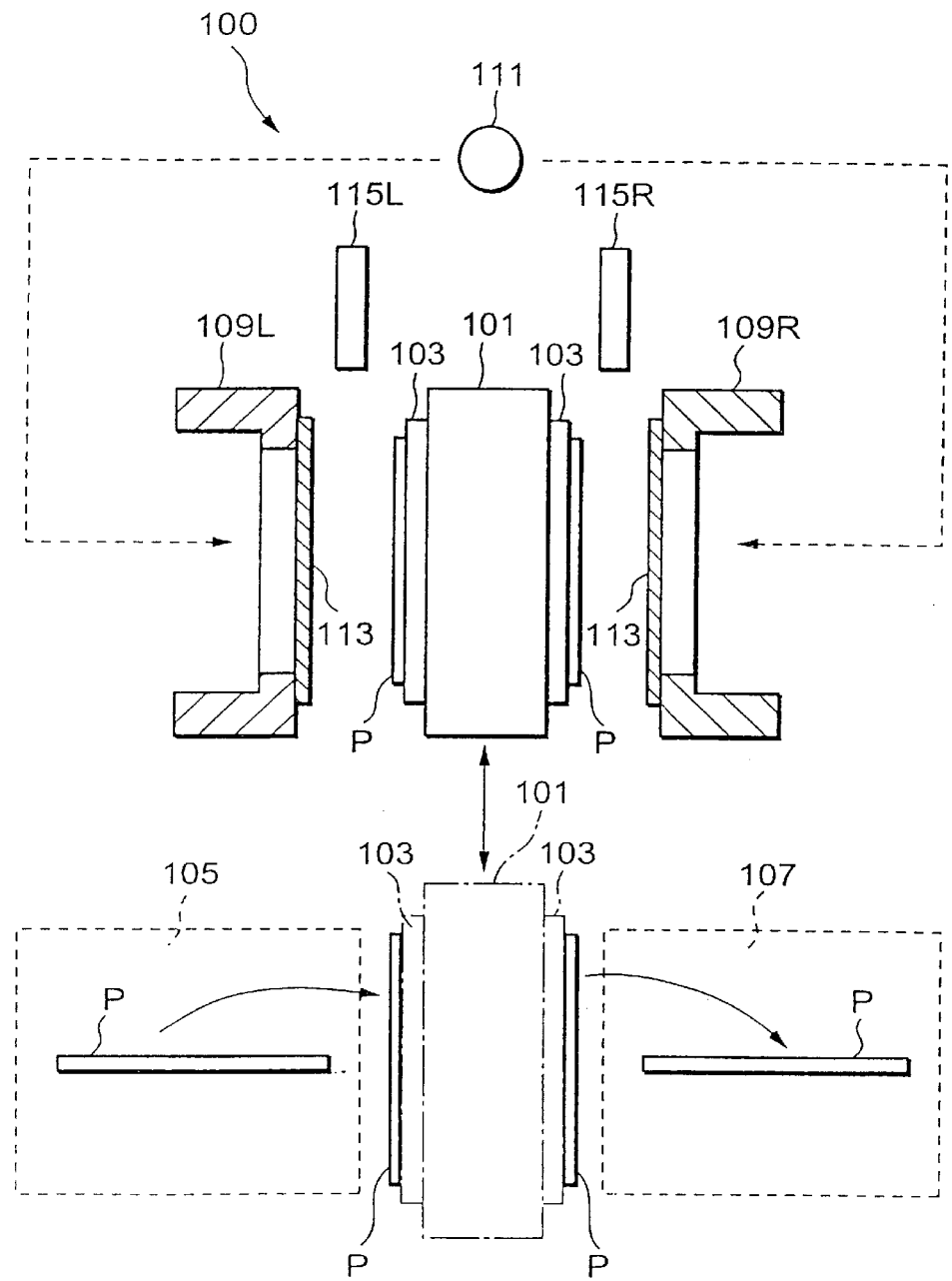
FIG. 13 is a schematic front elevation of an essential part of a prior art double-sided exposure system.

Subsequently, the work elevator 21L of the first processing unit 25L is raised for "ascent", the mask holding mechanism 23L is operated for "advancement" and "alignment", the second processing unit 25R completes the exposure operation, the mask holding mechanism 23R is retracted for "retraction", the work elevator 21R is moved to the home position, and the unloading device 35 receives the substrate P having the opposite surfaces processed by the exposure operation from the work elevator 21R as shown in FIG. 11. The thus processed substrate P is delivered by the delivery conveyor 37 outside the case 3. Thereafter, operations described above in connection with FIGS. 8, 9, 10 and 11 are repeated.

As obvious from the time chart shown in FIG. 12, there is not any idle time in which any operations are not executed. The cycle time of the exposure operation shown in FIG. 12 is 26.5 s, which is shorter by about 17% than the cycle time of 32 s of the exposure operation shown in FIG. 14B of the prior art exposure system 100 in which the exposure time is 8 s. In other words, although the exposure time for one surface is increased by 5 s from 3 s and the exposure time for both the surfaces is increased by 10 s, increase in time for both the surfaces can be limited to 4.5 s. (The time loss of 0.5 s in FIG. 14A is absorbed.)

Although the present invention has been described as applied to the double-sided exposure system for the exposure of the resist films formed on both the surfaces of the substrate, the present invention is not limited there to in its practical application and may be applied to various types of double-sided exposure systems for exposing both the surfaces of plate-shaped work to be exposed through exposure masks provided with predetermined exposure patterns to light.

Although the foregoing double-sided exposure system according to the present invention is provided with the work elevators that move vertically, the present invention is applicable to a double-sided exposure system provided with work holder corresponding to the work elevators and designed to move in horizontal directions.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A double-sided exposure system for exposing a pair of opposite side surfaces of a plate to light through a pair of exposure masks respectively provided with necessary exposure patterns, said double-sided exposure system comprising:

a first mask holding mechanism holding a first exposure mask to be used in exposing a first surface of the plate to light;

a first work holding device holding said plate and capable of moving between a first exposure position in front of the first mask holding mechanism and a first home position where an exposed plate is mounted thereon;

a second mask holding mechanism holding a second exposure mask to be used in exposing a second surface of the plate to light;

a second work holding device holding said plate and capable of moving between a second exposure position in front of the second mask holding mechanism and a second home position where the two-sided exposed plate is removed therefrom;

a single light source;

an optical system for selectively transmitting light from said light source to a first optical path leading to the first exposure position or a second optical path leading to the second exposure position; and a work transfer mechanism capable of receiving the plate whose first surface has been exposed to light at the first exposure position from the first work holding device and transferring the plate to the second work holding device so that the second surface of the plate can be exposed to light.

2. The double-sided exposure system according to claim 1, wherein the first work holding device is capable of holding the plate in a vertical position at least during an exposure operation for exposing the first surface of the plate to light.

3. The double-sided exposure system according to claim 1, wherein the second work holding device is capable of holding the plate in a vertical position at least during an exposure operation for exposing the second surface of the plate to light.

4. The double-sided exposure system according to claim 1, wherein the first mask holding mechanism and the second mask holding mechanism are disposed opposite to each other, the transfer mechanism includes a first work carrying device and a second work carrying device, and the work transfer mechanism transfers the plate from the first work carrying device to the second work carrying device in a space between the first mask holding mechanism and the second mask holding mechanism disposed opposite to each other with at least one of the first work holding mechanism and the second work holding mechanism disposed at their home positions.

5. The double-sided exposure system according to claim 1, wherein the plate is a substrate having a pair of opposite side surfaces coated respectively with resist films for fabricating a printed wiring board.

6. The double-sided exposure system according to claim 1, wherein said first and second work holding devices are movable independently of one another between the respective exposure position and the respective home position.

7. The double-sided exposure system according to claim 1, wherein said first and second work holding devices operate in sequence so that said first and second surfaces of said plate are exposed to light successively.

8. The double-sided exposure system according to claim 1, wherein each surface of said plate is exposed to light through the respective mask over the entire surface of the mask.

* * * * *